United States Patent
Chang et al.

(10) Patent No.: US 9,537,094 B2
(45) Date of Patent: Jan. 3, 2017

(54) LOGIC COMPATIBLE RRAM STRUCTURE AND PROCESS

(71) Applicant: Taiwan Semiconductor Manufacturing Company, Ltd., Hsin-Chu (TW)

(72) Inventors: Chih-Yang Chang, Changhua County (TW); Hsia-Wei Chen, Taipei (TW); Chin-Chieh Yang, New Taipei (TW); Kuo-Chi Tu, Hsin-Chu (TW); Wen-Ting Chu, Kaohsiung (TW); Yu-Wen Liao, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/985,102

(22) Filed: Dec. 30, 2015

(65) Prior Publication Data
US 2016/0118583 A1    Apr. 28, 2016

Related U.S. Application Data

(60) Division of application No. 13/831,629, filed on Mar. 15, 2013, now Pat. No. 9,231,197, which is a continuation-in-part of application No. 13/674,193, filed on Nov. 12, 2012, now Pat. No. 8,742,390.

(51) Int. Cl.
*H01L 45/00*    (2006.01)

(52) U.S. Cl.
CPC ......... *H01L 45/1608* (2013.01); *H01L 45/04* (2013.01); *H01L 45/122* (2013.01); *H01L 45/1233* (2013.01); *H01L 45/1253* (2013.01); *H01L 45/146* (2013.01); *H01L 45/1666* (2013.01); *H01L 45/1675* (2013.01)

(58) Field of Classification Search
CPC .. H01L 45/04; H01L 45/1608; H01L 45/1233; H01L 45/1253; H01L 45/1666; H01L 27/2481; H01L 45/146; H01L 45/122; H01L 45/1675
See application file for complete search history.

(56) References Cited

U.S. PATENT DOCUMENTS

| 5,166,758 | A  | 11/1992 | Ovshinsky et al. |
| 5,985,698 | A  | 11/1999 | Gonzalez et al. |
| 6,677,647 | B1 | 1/2004  | Dawson |

(Continued)

*Primary Examiner* — Latanya N Crawford
(74) *Attorney, Agent, or Firm* — Haynes and Boone, LLP (57) ABSTRACT

A memory cell and method including a first electrode formed through a first opening in a first dielectric layer, a resistive layer formed on the first electrode, a spacing layer formed on the resistive layer, a second electrode formed on the resistive layer, and a second dielectric layer formed on the second electrode, the second dielectric layer including a second opening. The first dielectric layer formed on a substrate including a first metal layer. The first electrode and the resistive layer collectively include a first lip region that extends a first distance beyond the first opening. The second electrode and the second dielectric layer collectively include a second lip region that extends a second distance beyond the first opening. The spacing layer extends from the second distance to the first distance. The second electrode is coupled to a second metal layer using a via that extends through the second opening.

20 Claims, 9 Drawing Sheets

(56) References Cited

U.S. PATENT DOCUMENTS

| | | |
|---|---|---|
| 6,737,728 B1 | 5/2004 | Block et al. |
| 6,781,185 B2 | 8/2004 | Chen et al. |
| 6,803,641 B2 | 10/2004 | Papa Rao et al. |
| 6,849,891 B1 | 2/2005 | Hsu et al. |
| 6,936,881 B2 | 8/2005 | Yeo et al. |
| 6,937,457 B2 | 8/2005 | Shih et al. |
| 6,940,705 B2 | 9/2005 | Yeo et al. |
| 7,195,970 B2 | 3/2007 | Tu et al. |
| 7,407,858 B2 | 8/2008 | Li et al. |
| 7,557,399 B2 | 7/2009 | Tu et al. |
| 7,897,950 B2 | 3/2011 | Shoji |
| 8,000,128 B2 | 8/2011 | Li et al. |
| 8,009,454 B2 | 8/2011 | Lee et al. |
| 8,586,958 B2 * | 11/2013 | Sakamoto .......... G11C 13/0009 257/3 |
| 8,742,390 B1 * | 6/2014 | Tu .......................... H01L 45/04 257/4 |
| 8,872,149 B1 * | 10/2014 | Hsieh ..................... H01L 45/04 257/2 |
| 8,963,114 B2 * | 2/2015 | Liao ....................... H01L 45/04 257/2 |
| 9,231,197 B2 * | 1/2016 | Tu ........................... H01L 45/04 |
| 2006/0054950 A1 | 3/2006 | Baek et al. |
| 2007/0298535 A1 | 12/2007 | Lung |
| 2010/0110758 A1 * | 5/2010 | Li ...................... G11C 13/0007 365/148 |
| 2011/0031461 A1 * | 2/2011 | Kang .................. G11C 11/5678 257/3 |
| 2011/0272664 A1 | 11/2011 | Tada et al. |
| 2014/0131654 A1 | 5/2014 | Tu et al. |
| 2014/0166961 A1 * | 6/2014 | Liao .................... H01L 45/1253 257/4 |
| 2014/0203236 A1 * | 7/2014 | Chen ..................... H01L 45/16 257/4 |
| 2014/0252295 A1 | 9/2014 | Liao et al. |
| 2014/0258626 A1 | 9/2014 | Kang |
| 2014/0264222 A1 | 9/2014 | Yang et al. |

* cited by examiner

LOGIC COMPATIBLE RRAM STRUCTURE AND PROCESS

The present application is a divisional application of U.S. patent application Ser. No. 13/831,629, filed Mar. 15, 2013, which is a continuation-in-part of U.S. patent application Ser. No. 13/674,193, filed Nov. 12, 2012, each of which is incorporated herein by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices. Resistive random access memory (RRAM) is a nonvolatile memory type that is one possible candidate for future advancement in memory technology. Generally, RRAM cells typically use a dielectric material, which although normally insulating can be made to conduct through a filament or conduction path formed after application of a specific voltage. Once the filament is formed, it may be set (i.e., re-formed, resulting in a lower resistance across the RRAM cell) or reset (i.e., broken, resulting in a high resistance across the RRAM cell) by appropriately applied voltages. The low and high resistance states can be utilized to indicate a digital signal of "1" or "0" depending upon the resistance state, and thereby provide a nonvolatile memory cell that can store a bit.

Embedded memory products, like many other semiconductor products, face fabrication time and cost pressures. The ability to fabricate RRAM cells using fewer and/or simpler process steps is highly desirable. RRAM cells that may be formed using, at least in part, some of the same process steps that simultaneously form desired structures in the logic region of a device are also highly desirable. Accordingly, it would be desirable to provide an improved RRAM cell structure and fabrication process.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

Figure 1:
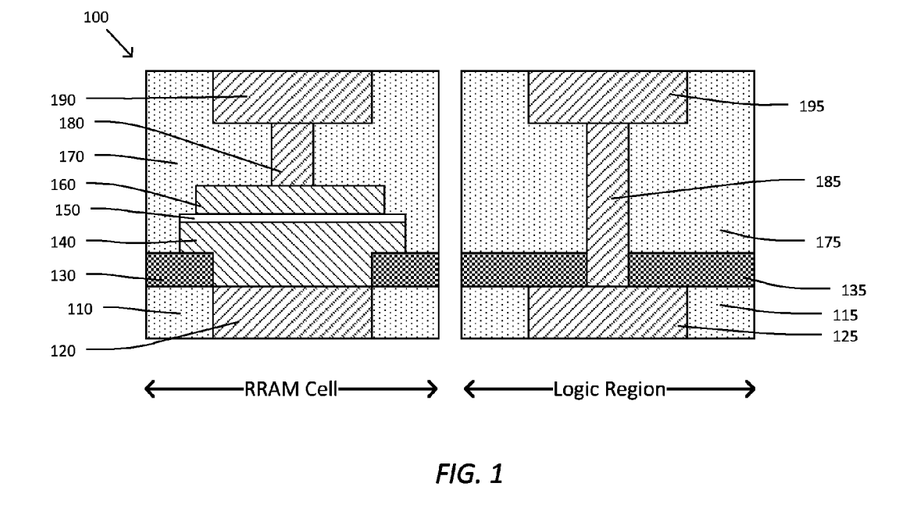
FIG. 1 is a simplified diagram showing a cross-sectional representation of a first RRAM cell.

FIG. 1 is a simplified diagram showing a cross-sectional representation of a first RRAM cell 100. As shown in FIG. 1, the first RRAM cell 100 is formed on a substrate including a first dielectric region 110 with an embedded first metal layer 120. The first metal layer 120 is used to couple the RRAM cell 100 to other circuitry in the semiconductor device. The RRAM cell 100 is isolated from the first dielectric region 110 using a stop layer 130 that is partially removed to create an opening to expose the first metal layer 120. A first electrode 140 is formed on the exposed first metal layer 120 and the stop layer 130. A resistive layer 150 is formed on the first electrode 140 and typically extends to the same width as the first electrode 140. A second electrode 170 is formed on the resistive layer 150. The RRAM cell is coupled to a second metal layer 190 through a via 180 formed between the second metal layer 190 and the second electrode 160. The upper portion of the RRAM cell is embedded in a second dielectric region 170.

FIG. 1 also depicts one possible structure in a corresponding logic region of the same semiconductor device. For example, an interconnection via 185 is shown coupling a third metal layer 125 embedded in a third dielectric region 115 to a fourth metal layer 195. The via 185 couples a third metal layer 125 and the fourth metal layer 195 through a stop layer 135. The via 185 can be substantially embedded in a fourth dielectric region 175.

Figure 2:
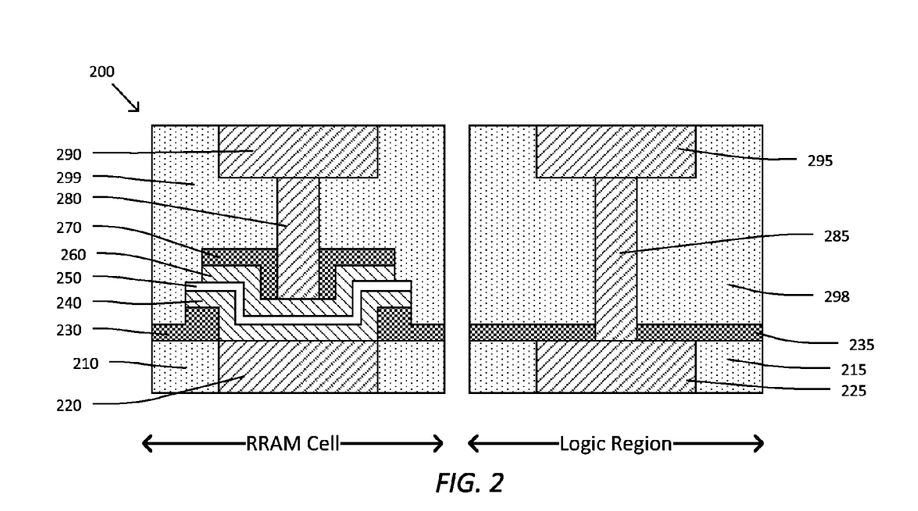
FIG. 2 is a simplified diagram showing a cross-sectional representation of a second RRAM cell according to certain embodiments of the present invention.

FIG. 2 is a simplified diagram showing a cross-sectional representation of a second RRAM cell 200 according to certain embodiments of the present invention. As shown in FIG. 2, the second RRAM cell 200 may be formed on a substrate including a first dielectric region 210 with an embedded first metal layer 220. The first metal layer 220 may be used as a first contact and is used to couple the RRAM cell 200 to other circuitry in the semiconductor device. The first metal layer 220 may be in any metallization layer of a semiconductor device including any one of the first, second, third, fourth, or fifth metallization layers.

A first stop layer 230 is formed over the first dielectric region 210 and the first metal layer 220. A portion of the first stop layer 230 is removed to create an opening that may expose at least a portion of the first metal layer 220 to the RRAM cell 200. In some embodiments, the first stop layer 230 typically has a thickness between 10 nm and 50 nm. According to some embodiments, the first stop layer 230 includes one or more dielectrics. For example, each of the one or more dielectrics is selected from a group consisting of SiC, SiON, $Si_3N_4$, and the like.

A first electrode 240 is conformally formed over the first stop layer 230 and the exposed first metal layer 220. The first electrode 240 extends over the exposed first metal layer 220 and forms a lip region that extends over a portion of the first stop layer 230. In some embodiments, the lip region may extend beyond the opening in the first stop layer 230 a distance that varies between 20 nm and 60 nm. In some embodiments, the first electrode 240 may vary in thickness between 3 nm and 50 nm. In some embodiments, the first electrode 240 includes one or more metals. For example, each of the one or more metals is selected from a group consisting of Pt, AlCu, TiN, Au, Ti, Ta, TaN, W, WN, Cu, and the like.

A resistive layer 250 is conformally formed over the first electrode 240. The resistive layer 250 extends over the first electrode 240 and forms a lip region that extends to substantially the same width as the first electrode 240. In some embodiments, the resistive layer 250 may vary in thickness between 1 nm and 30 nm. In some embodiments, the resistive layer 250 includes one or more metal oxides. For example, the one or more metal oxides are each selected from a group consisting of NiO, TiO, HfO, ZrO, ZnO, $WO_3$, $Al_2O_3$, TaO, MoO, CuO, and the like. In some embodiments, the resistive layer may include HfO with a resistivity on the order of $10^{14}$ Ω·cm. According to some embodiments, the resistive layer 250 has a high resistance state that varies between 100 kΩ and 10 MΩ and a low resistance state that varies between 1 kΩ and 100 kΩ.

A second electrode 260 is conformally formed on the resistive layer 250. The second electrode 260 extends over the resistive layer 250 and forms a lip region that extends over a portion of the resistive layer 250. In some embodiments, the lip region may extend over the resistive layer 250 to within 10 nm to 30 nm of the end of the corresponding lip region on the resistive layer 250. In some embodiments, the second electrode 260 may vary in thickness between 3 nm and 50 nm. In some embodiments, the second electrode 260 includes one or more metals. For example, each of the one or more metals is selected from a group consisting of Pt, AlCu, TiN, Au, Ti, Ta, TaN, W, WN, Cu, and the like.

A second stop layer 270 is conformally formed on the second electrode 260. The second stop layer 270 extends over the second electrode 260 and forms a lip region that extends to substantially the same width as the second electrode 260. A portion of the second stop layer 270 is removed from a central region of the second stop layer 270 to expose a portion of the second electrode 260 so that an electrical connection can be made. In some embodiments, the second stop layer 270 may vary in thickness between 10 nm and 50 nm. According to some embodiments, the second stop layer 270 includes one or more dielectrics. For example, each of the one or more dielectrics is selected from a group consisting of SiC, SiON, $Si_3N_4$, and the like.

The RRAM cell is coupled to a second metal layer 290 through a via 280 formed between the second metal layer 290 and the second electrode 260. The upper portion of the RRAM cell is embedded in a second dielectric region 299. The second metal layer 290 may be in any metallization layer of the semiconductor device including any one of the second, third, fourth, fifth, or sixth metallization layers.

FIG. 2 also depicts one possible structure in a corresponding logic region of the same semiconductor device. For example, an interconnection via 285 is shown coupling a third metal layer 225 embedded in a third dielectric region 215. The interconnection via 285 couples a third metal layer 225 and a fourth metal layer 295 through a third stop layer 235. The interconnection via 285 can be substantially embedded in a fourth dielectric region 298. As further depicted in FIG. 2, the RRAM cell 200 and the corresponding logic region are depicted side-by-side to show the relationships between the various layers in the various regions of the semiconductor device. For example, the first dielectric region 210 and the third dielectric region 215 may be the same, the first metal layer 220 and the third metal layer 225 may both be in the same metallization layer of the semiconductor device, the first stop layer 230 and the third stop layer 235 may be the same, the second dielectric regions 299 and the fourth dielectric region 298 may be the same, and the second metal layer 290 and the fourth metal layer 295 may both be in the same metallization layer of the semiconductor device.

As discussed above and further emphasized here, FIG. 2 is merely an example, which should not unduly limit the scope of the claims. One of ordinary skill in the art would recognize many variations, alternatives, and modifications. According to some embodiments, the first electrode layer 240, the resistive layer 250, the second electrode layer 260, and the second stop layer 270 each form a lip region that extends substantially the same distance over the first stop layer 230. In some embodiments, each of the lip regions may extend beyond the opening in the first stop layer 230 a distance that varies between 10 nm and 60 nm.

Figure 3:
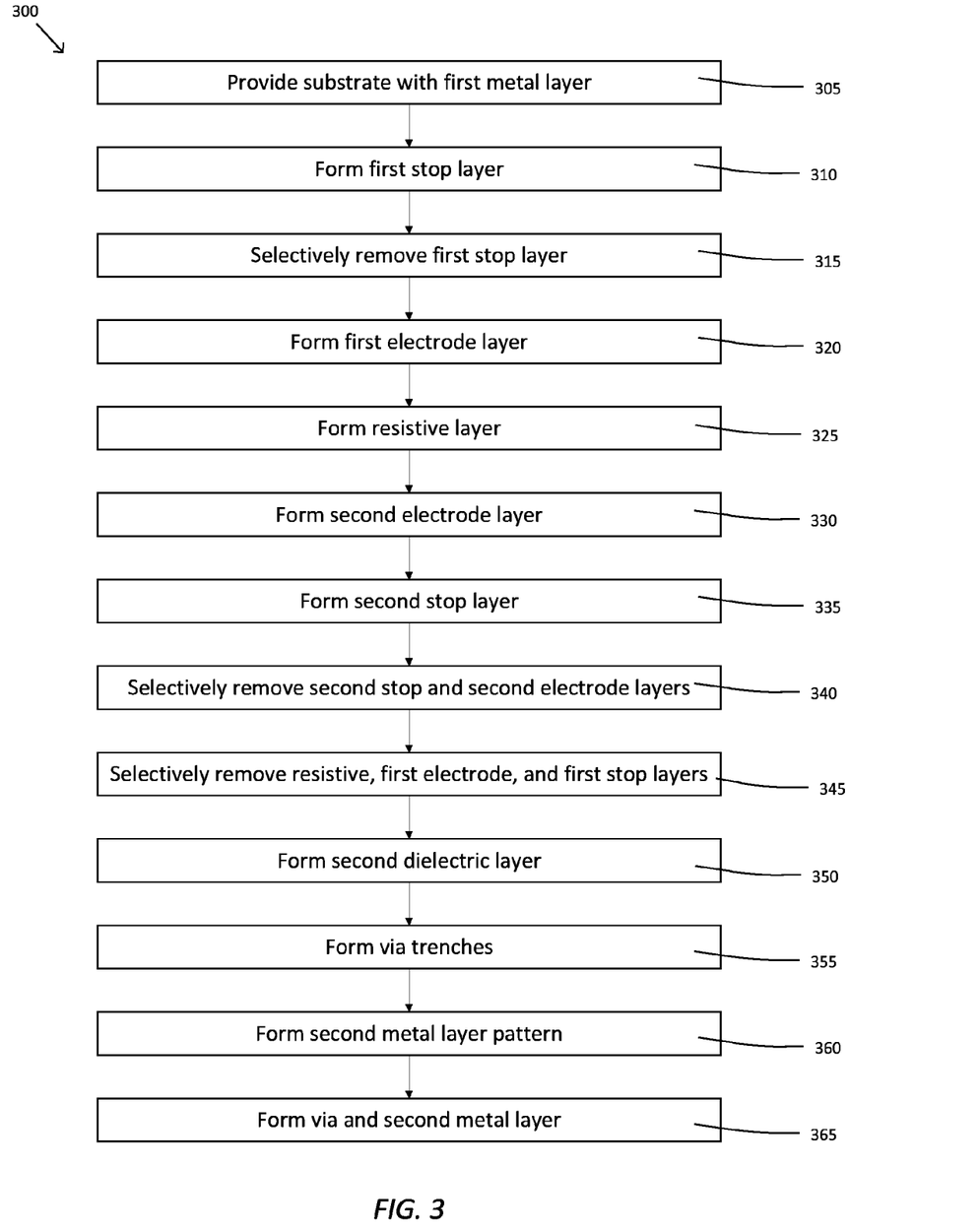
FIG. 3 is a simplified diagram showing a method for making the RRAM cell of FIG. 2 according to one embodiment of the present invention.

FIG. 3 is a simplified diagram showing a method 300 for making the RRAM cell 200 of FIG. 2 according to one embodiment of the present invention. As shown in FIG. 3, the method 300 includes a process 305 for providing a substrate with a first metal layer, a process 310 for forming a first stop layer, a process 315 for selectively removing the first stop layer, a process 320 for forming a first electrode layer, a process 325 for forming a resistive layer, a process 330 for forming a second electrode layer, a process 335 for forming a second stop layer, a process 340 for selectively removing the second stop layer and the second electrode layers, a process 345 for selectively removing the resistive layer, the first electrode, and the first stop layer, a process 350 for forming a second dielectric layer, a process 355 for forming a via trench, a process 360 for forming a second metal layer pattern, and a process 365 for forming a via and a second metal layer. According to certain embodiments, the method 300 of making an RRAM cell 200 can be performed using variations among the processes 305-365 as would be recognized by one of ordinary skill in the art.

The method 300 will be further described below with reference to a series of cross-sectional images in FIGS. 4a-4i, culminating in the RRAM cell 200.

Figure 4A:
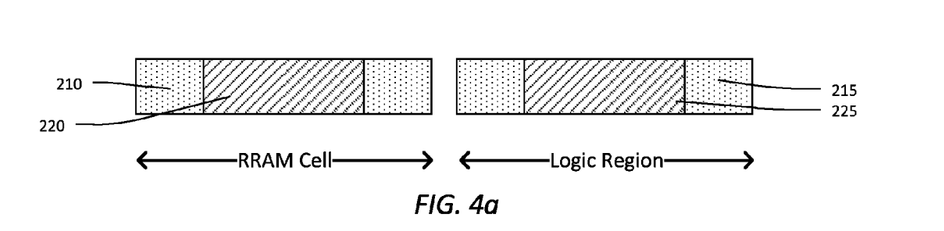
FIGS. 4a-4i show simplified diagrams of cross-sectional representations of the second RRAM cell during various fabrication processes according to certain embodiments of the present invention.

FIG. 4a shows a simplified diagram of a cross-sectional representation of a substrate according to certain embodiments of the present invention. At the process 305, the substrate with a first metal layer 220 as shown in FIG. 4a is provided. The substrate includes the first metal layer 220 embedded in a first dielectric region 210 in the area of an RRAM cell and a corresponding third metal layer 225 embedded in a third dielectric region 215. In some embodiments, the first dielectric region 210 and the third dielectric region 215 may be the same and the first metal layer 220 and the third metal layer 225 may be in the same metallization layer of the substrate. The substrate is formed using any suitable process and may have been previously planarized using chemical-mechanical polishing (CMP).

Figure 4B:
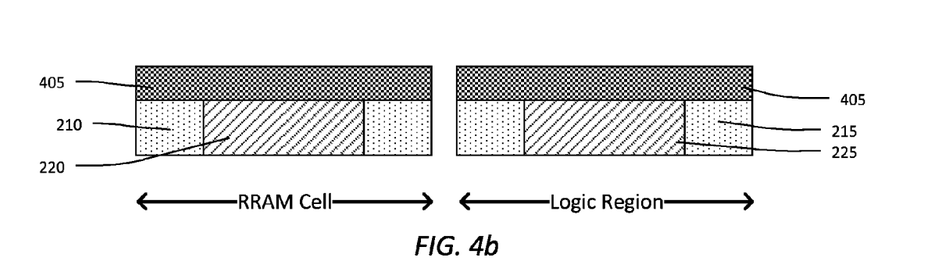

FIG. 4b shows a simplified diagram of a cross-sectional representation of the partially formed RRAM cell with a first stop layer 405 formed thereon according to certain embodiments of the present invention. At the process 310, a first stop layer 405 is formed on the substrate as shown in FIG. 4b. The first stop layer 405 is formed over the first dielectric region 210 and the first metal layer 220 as well as the third dielectric region 215 and the third metal layer 225. The first stop layer 405 is typically formed using chemical vapor deposition (CVD) or physical vapor deposition (PVD). However, any suitable deposition process may be used in process 310 to form the first stop layer 405. In some embodiments, the first stop layer 405 may have a thickness between 10 nm and 50 nm. According to some embodiments, the first stop layer 405 includes one or more dielectrics. For example, each of the one or more dielectrics is selected from a group consisting of SiC, SiON, $Si_3N_4$, and the like.

Figure 4C:
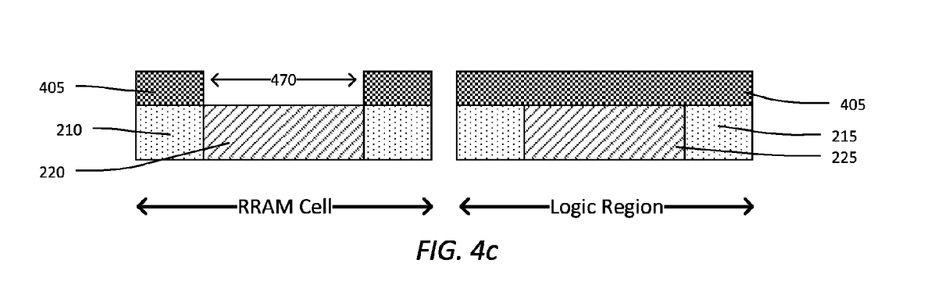

FIG. 4c shows a simplified diagram of a cross-sectional representation of the partially formed RRAM cell with a portion of the first stop layer 405 selectively removed according to certain embodiments of the present invention. At the process 315, a portion of the first stop layer 405 is selectively removed to form an opening 470 as shown in FIG. 4c. The opening 470 is typically located in the area of the first metal layer 220 and is removed to expose a portion of the first metal layer 220 for further processing. The portion of the first stop layer 405 is typically removed using a photolithography process using a mask. For example, the photolithography process using a mask is a multi-step process involving coating a substrate with a photoresist, baking the photoresist, exposing the photoresist with a pattern mask identifying the regions where material is to be removed and where material is to be kept, developing the photoresist to form an etching pattern, etching away a portion of the substrate using a wet or dry etching process, and removing the photoresist. According to some embodiments, the first stop layer 405 may be etched using a dry etching process, however any suitable etching process may be used.

Figure 4D:
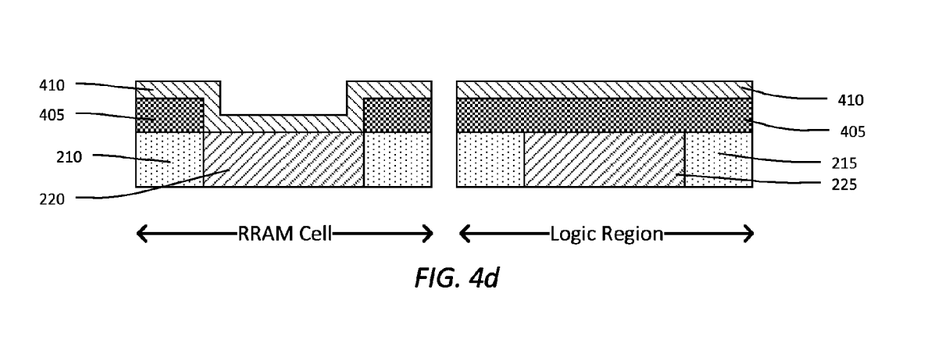

FIG. 4d shows a simplified diagram of a cross-sectional representation of the partially formed RRAM cell with a first electrode layer 410 formed thereon according to certain embodiments of the present invention. At the process 320, the first electrode layer 410 is formed on the first stop layer 405 and the first metal layer 220. The first electrode layer 410 is typically formed using CVD, PVD, or atomic layer deposition (ALD). However, any suitable deposition process may be used in process 320 to form the first electrode layer 410. The first electrode layer 410 is typically conformal. In some embodiments, by forming a conformal first electrode layer 410, a CMP process step to planarize the first electrode layer 410 is typically avoided. In some embodiments, the first electrode layer 410 can typically have a thickness between 30 nm and 50 nm. In some embodiments, the first electrode layer 410 includes one or more metals. For example, each of the one or more metals is selected from a group consisting of Pt, AlCu, TiN, Au, Ti, Ta, TaN, W, WN, Cu, and the like.

Figure 4E:
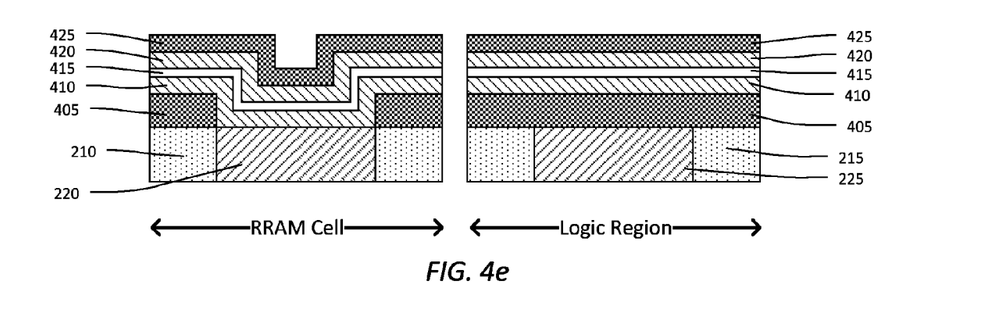

FIG. 4e shows a simplified diagram of a cross-sectional representation of the partially formed RRAM cell with a resistive layer 415, a second electrode layer 420, and a second stop layer 425 formed thereon according to certain embodiments of the present invention. At the process 325 the resistive layer 415 is formed on the first electrode layer 410. The resistive layer 415 is typically formed using CVD or ALD. However, any suitable deposition process may be used in process 325 to form the resistive layer 415. The resistive layer 415 is typically conformal. In some embodiments, the resistive layer 415 may have a thickness between 1 nm and 30 nm. In some embodiments, the resistive layer 415 includes one or more metal oxides. For example, the one or more metal oxides are each selected from a group consisting of NiO, TiO, HfO, ZrO, ZnO, $WO_3$, $Al_2O_3$, TaO, MoO, CuO, and the like.

At the process 330, the second electrode layer 420 is formed on the resistive layer 415. The second electrode layer 420 is typically formed using CVD, PVD, or ALD. However, any suitable deposition process may be used in process 330 to form the second electrode layer 420. The second electrode layer 420 is typically conformal. In some embodiments, by forming a conformal second electrode layer 420, a CMP process step to planarize the second electrode layer 420 is typically avoided. In some embodiments, the second electrode layer 420 may have a thickness between 30 nm and 50 nm. In some embodiments, the second electrode layer 420 includes one or more metals. For example, each of the one or more metals is selected from a group consisting of Pt, AlCu, TiN, Au, Ti, Ta, TaN, W, WN, Cu, and the like.

At the process 335, a second stop layer 425 is formed as shown in FIG. 4e. The second stop layer 425 is formed over the second electrode layer 420. The second stop layer 425 is typically formed using CVD or PVD. However, any suitable deposition process may be used in process 335 to form the second stop layer 425. The second stop layer 425 is conformal to streamline later process steps in method 300. In some embodiments, the second stop layer 425 may typically have a thickness between 10 nm and 50 nm. According to some embodiments, the second stop layer 425 includes one or more dielectrics. For example, each of the one or more dielectrics is selected from a group consisting of SiC, SiON, $Si_3N_4$, and the like.

Figure 4F:
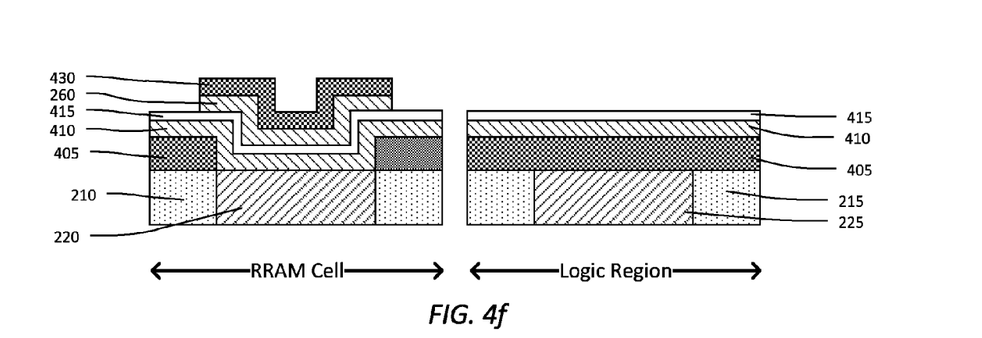

FIG. 4f shows a simplified diagram of a cross-sectional representation of the partially formed RRAM cell after removal of portions of the second stop layer 425 and second electrode layer 420 according to certain embodiments of the present invention. At the process 340 selected portions of the second stop layer 425 and second electrode layer 420 are removed as shown in FIG. 4f. The selected portions of the second stop layer 425 and second electrode layer 420 are typically removed using a photolithography process using a mask. According to some embodiments, the second stop layer 425 and the second electrode layer 420 may be etched using a dry etching process, however any suitable etching process may be used. Sufficient portions of the second stop layer 425 are removed to form a second stop layer portion 430 within the RRAM cell and sufficient portions of the second electrode layer 420 are removed to form the second electrode 260. Only sufficient portions of the second stop layer 425 and the second electrode layer 420 are removed so that both the second stop layer portion 430 and the second electrode 420 collectively form a first lip region over the resistive layer 415 that extends beyond an area defined by the opening 470 (see FIG. 4c) in the first stop layer 405.

According to some embodiments, the first lip region may extend beyond the opening 470 by 10 nm to 60 nm on each side.

Figure 4G:
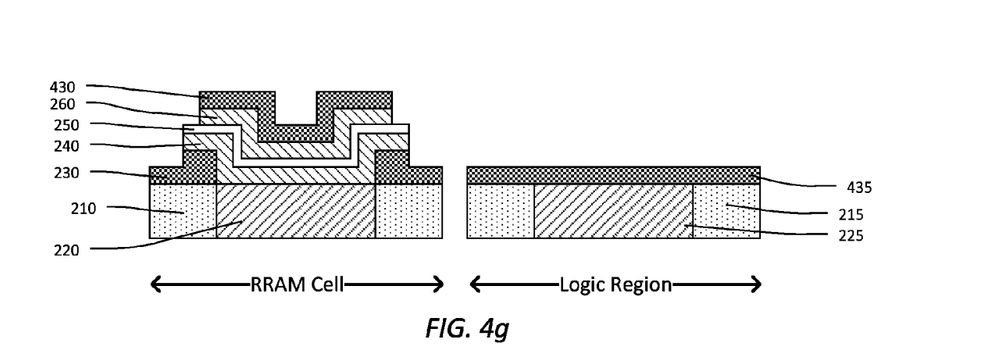

FIG. 4g shows a simplified diagram of a cross-sectional representation of the partially formed RRAM cell after removal of portions of the resistive layer 415, first electrode layer 410, and first stop layer 405 according to certain embodiments of the present invention. At the process 345 selected portions of resistive layer 415, first electrode layer 410, and first stop layer 405 are removed as shown in FIG. 4g. The selected portions of the resistive layer 415, first electrode layer 410, and first stop layer 405 are typically removed using a photolithography process using a mask. According to some embodiments, the resistive layer 415, first electrode layer 410, and first stop layer 405 may be etched using a dry etching process, however any suitable etching process may be used. Sufficient portions of the resistive layer 415 are removed to form the RRAM resistive layer 250, sufficient portions of the first electrode layer 410 are removed to form the first electrode 240, and sufficient portions of the first stop layer 405 are removed to form the first stop layer 230 within the RRAM cell and a thinned third stop layer 435 in the logic portion of the semiconductor device. Only sufficient portions of the resistive layer 415 and the first electrode layer 410 are removed so that both the RRAM resistive layer 250 and the first electrode 230 collectively form a second lip region over the first stop layer 230 that extends beyond an area defined by the opening 470 (see FIG. 4c) in the first stop layer 405. According to some embodiments, the second lip region may extend beyond the opening 470 by 10 nm to 60 nm on each side. In some embodiments, the second lip region extends beyond the opening 470 substantially the same distance as the first lip region on each side. In some embodiments, the second lip region extends beyond the first lip region by 10 nm to 30 nm on each side. Only a sufficient thickness of the first stop layer 405 is removed so that the remaining first stop layer 230 and thinned third stop layer 435 may be used in subsequent processing steps.

Figure 4H:
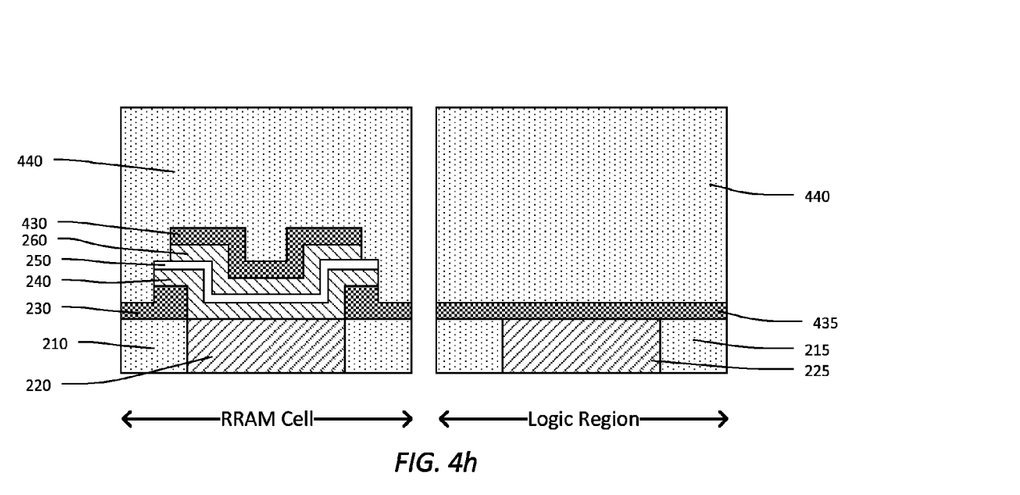

FIG. 4h shows a simplified diagram of a cross-sectional representation of the partially formed RRAM cell with a second dielectric region 440 formed thereon according to certain embodiments of the present invention. At the process 350, the second dielectric region 440 is typically formed using CVD, PVD, or ALD. However, any suitable deposition process may be used in process 350 to form the second dielectric region 440.

Figure 4I:
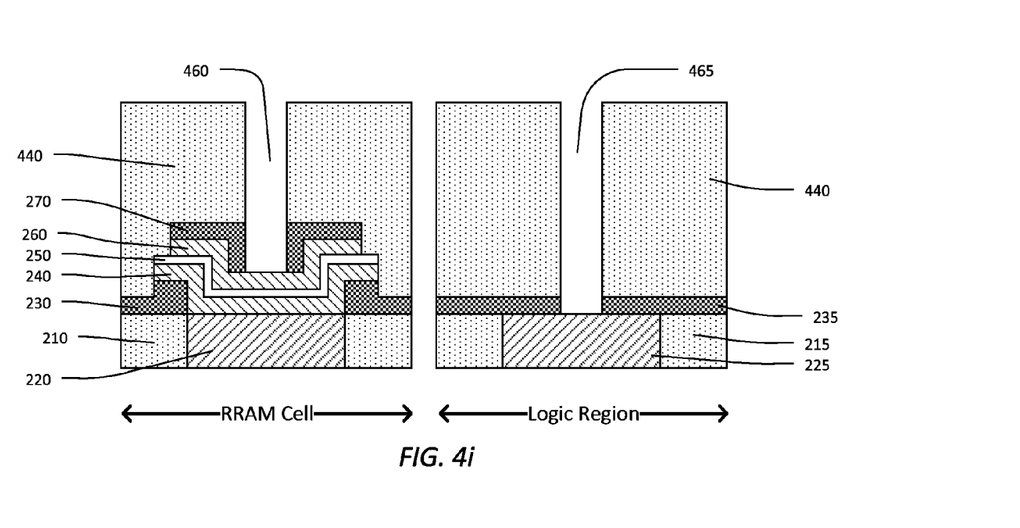

FIG. 4i shows a simplified diagram of a cross-sectional representation of the partially formed RRAM cell with via trenches 460 and 465 formed in the second dielectric region 440, second stop layer portion 430, and thinned third stop layer 435 according to certain embodiments of the present invention. At the process 355, portions of the second dielectric region 440, second stop layer portion 430, and thinned third stop layer 435 are selectively removed to form via trenches 460 and 465 in the partially formed RRAM cell and the logic region respectively as shown in FIG. 4i. The via trenches 460 and 465 are typically created using a photolithography process using a mask. According to some embodiments, the via trenches 460 and 465 may require a two step etching processing. The first etching step can be used to selectively remove a portion of the second dielectric region 440 where via trenches 460 and 465 are desired. The second etching step can be used to selectively remove a portion of the second stop layer portion 430 and the thinned third stop layer 435 where via trenches 460 and 465 are desired. Because a thickness of the RRAM cell between the first metal layer 220 and the second stop layer portion 430 is sufficiently small relative to a thickness of the second dielectric region 440 over the second stop layer portion 430 and the thinned third stop layer 435, it is possible to form both the via trench 460 in the RRAM cell and the via trench 465 in the logic region using the same process steps. In certain embodiments, a duration of the first etching step is carefully controlled so that it is long enough to not overly etch the second stop layer portion 430, which could result in damage to the RRAM cell during the second etching step, but long enough to expose the thinned third stop layer 435 in the logic region.

At the process 360, a second metal pattern is formed in the second dielectric region 440. Portions of the second dielectric region 440 are typically removed using a photolithography process using a mask to form the second metal pattern. According to some embodiments, the second dielectric region may be etched using a dry etching process, however any suitable etching process may be used.

At the process 365, vias 280 and 285, second metal layer 290, and fourth metal layer 295 are formed in the second dielectric region 440 to form the RRAM cell as shown in FIG. 2. The vias 280 and 285, second metal layer 290, and fourth metal layer 295 are typically formed using CVD, PVD, or ALD. However, any suitable deposition process may be used in process 365 to form the vias 280 and 285, second metal layer 290, and fourth metal layer 295.

Figure 5:
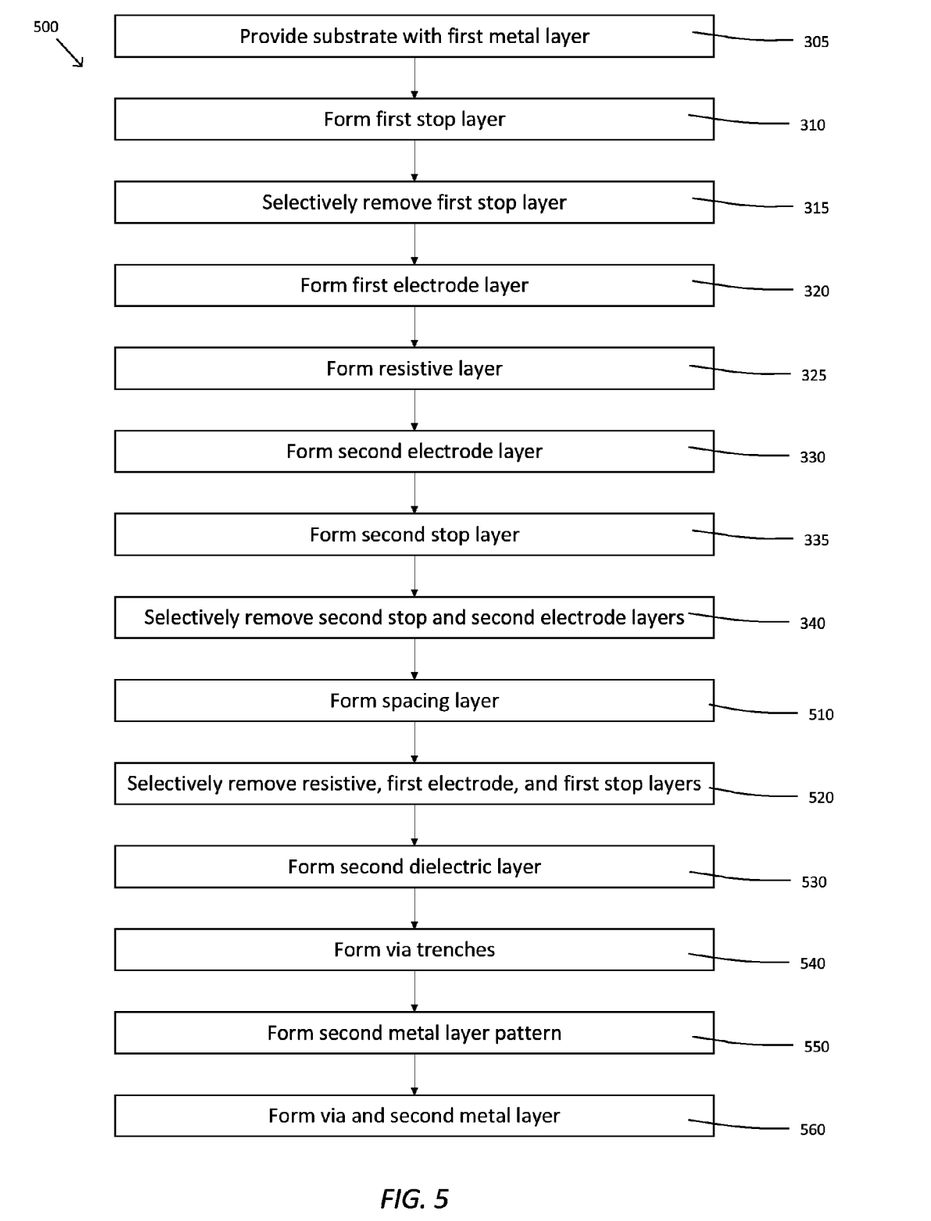
FIG. 5 is a simplified diagram showing a method for making a RRAM cell according to certain embodiments of the present invention.

FIG. 5 is a simplified diagram showing a method 500 for making a RRAM cell according to some embodiments of the present invention. As shown in FIG. 5, the method 500 includes a process 305 for providing a substrate with a first metal layer, a process 310 for forming a first stop layer, a process 315 for selectively removing the first stop layer, a process 320 for forming a first electrode layer, a process 325 for forming a resistive layer, a process 330 for forming a second electrode layer, a process 335 for forming a second stop layer, a process 340 for selectively removing the second stop layer and the second electrode layers, a process 510 for forming a spacing layer, a process 520 for selectively removing the resistive layer, the first electrode, and the first stop layer, a process 530 for forming a second dielectric layer, a process 540 for forming a via trench, a process 550 for forming a second metal layer pattern, and a process 560 for forming a via and a second metal layer. According to certain embodiments, the method 500 of making the RRAM cell can be performed using variations among the processes 305-340 and 510-560 as would be recognized by one of ordinary skill in the art.

The method 500 will be further described below with reference to a series of cross-sectional images in FIGS. 4a-4f and 6a-6e.

FIG. 4f shows a simplified diagram of a cross-sectional representation of the partially formed RRAM cell after performing the processes 305-340. The processes 305-340 are described above with respect to method 300 and FIGS. 3 and 4a-4f and are not repeated here.

Figure 6A:
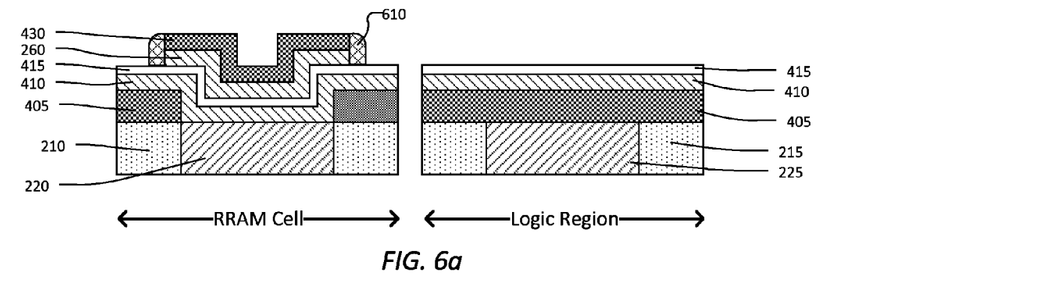
FIGS. 6a-6e show simplified diagrams of cross-sectional representations of a RRAM cell during various fabrication processes according to certain embodiments of the present invention.

FIG. 6a shows a simplified diagram of a cross-sectional representation of the partially formed RRAM cell after formation of a spacing layer 610. The spacing layer 610 is typically formed using CVD, PVD, or ALD. However, any suitable deposition process may be used in process 510 to form the spacing layer 610 over the resistive layer 415 around edges of the second stop layer portion 430 and the second electrode 260 beyond the first lip region. The spacing layer 610 is typically conformal. In some embodiments, the spacing layer 610 may have a thickness between 40 nm and 100 nm. In some embodiments, the spacing layer 610 may have a thickness substantially the same as the combined thickness of the second electrode 260 and the second stop layer 270. In some embodiments, the spacing layer 610 includes one or more oxides and/or one or more nitrides.

Figure 6B:
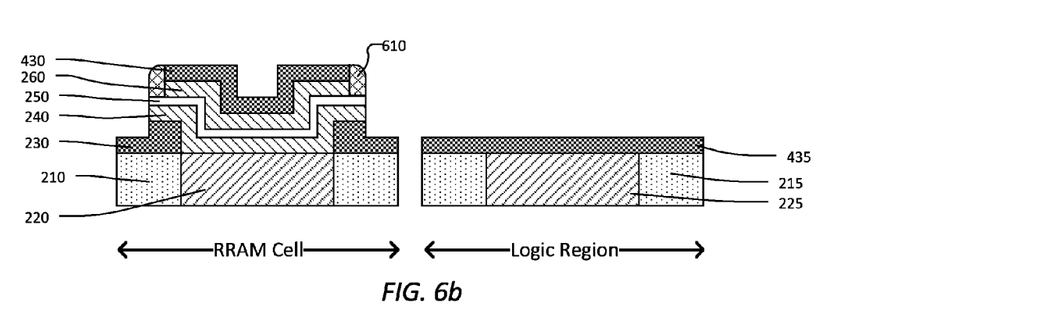

FIG. 6b shows a simplified diagram of a cross-sectional representation of the partially formed RRAM cell after removal of portions of the resistive layer 415, first electrode layer 410, and first stop layer 405 according to certain embodiments of the present invention. At the process 520 selected portions of resistive layer 415, first electrode layer 410, and first stop layer 405 are removed as shown in FIG. 6b. The selected portions of the resistive layer 415, first electrode layer 410, and first stop layer 405 are typically removed using a photolithography process using a mask. According to some embodiments, the resistive layer 415, first electrode layer 410, and first stop layer 405 may be etched using a dry etching process, however any suitable etching process may be used. Sufficient portions of the resistive layer 415 are removed to form the RRAM resistive layer 250, sufficient portions of the first electrode layer 410 are removed to form the first electrode 240, and sufficient portions of the first stop layer 405 are removed to form the first stop layer 230 within the RRAM cell and a thinned third stop layer 435 in the logic portion of the semiconductor device. Only sufficient portions of the resistive layer 415 and the first electrode layer 410 are removed so that both the RRAM resistive layer 250 and the first electrode 230 collectively form a second lip region over the first stop layer 230 that extends beyond an area defined by the opening 470 (see FIG. 4c) in the first stop layer 405. According to some embodiments, the spacing layer 610 may help prevent removal of the resistive layer 250 and the first electrode 230 in portions of the second lip region that extend beyond the first lip region. According to some embodiments, the second lip region may extend beyond the opening 470 by 10 nm to 60 nm on each side. In some embodiments, the second lip region extends beyond the first lip region by 10 nm to 30 nm on each side. Only a sufficient thickness of the first stop layer 405 is removed so that the remaining first stop layer 230 and thinned third stop layer 435 may be used in subsequent processing steps.

Figure 6C:
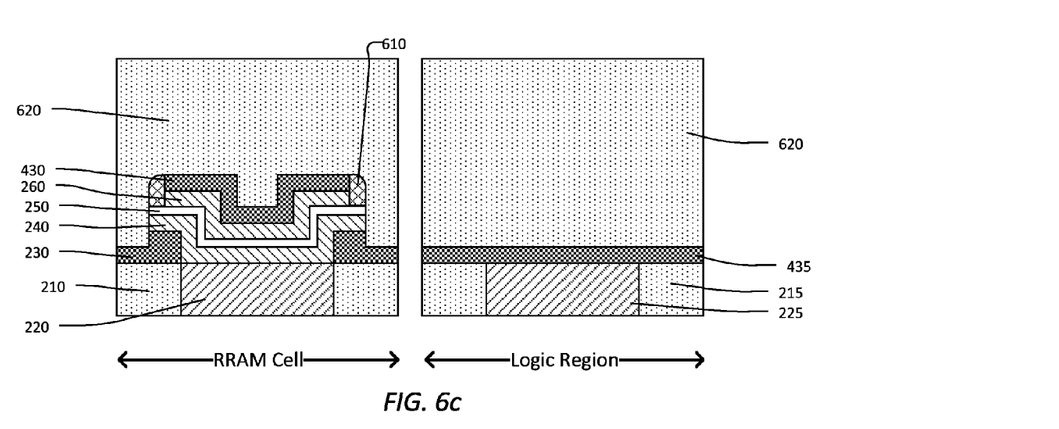

FIG. 6c shows a simplified diagram of a cross-sectional representation of the partially formed RRAM cell with a second dielectric region 620 formed thereon according to certain embodiments of the present invention. At the process 530, the second dielectric region 620 is typically formed using CVD, PVD, or ALD. However, any suitable deposition process may be used in process 530 to form the second dielectric region 620.

Figure 6D:
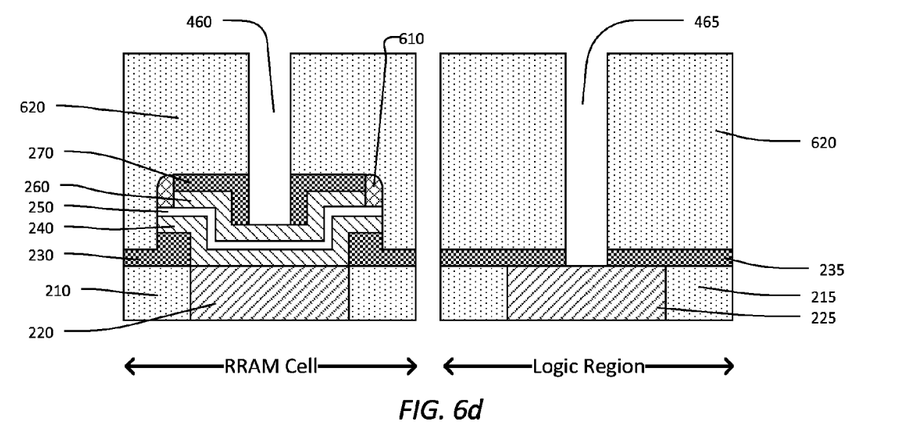

FIG. 6d shows a simplified diagram of a cross-sectional representation of the partially formed RRAM cell with via trenches 460 and 465 formed in the second dielectric region 620, second stop layer portion 430, and thinned third stop layer 435 according to certain embodiments of the present invention. At the process 540, portions of the second dielectric region 620, second stop layer portion 430, and thinned third stop layer 435 are selectively removed to form via trenches 460 and 465 in the partially formed RRAM cell and the logic region respectively as shown in FIG. 6d. The via trenches 460 and 465 are typically created using a photolithography process using a mask. According to some embodiments, the via trenches 460 and 465 may require a two step etching processing. The first etching step can be used to selectively remove a portion of the second dielectric region 620 where via trenches 460 and 465 are desired. The second etching step can be used to selectively remove a portion of the second stop layer portion 430 and the thinned third stop layer 435 where via trenches 460 and 465 are desired. Because a thickness of the RRAM cell between the first metal layer 220 and the second stop layer portion 430 is sufficiently small relative to a thickness of the second dielectric region 620 over the second stop layer portion 430 and the thinned third stop layer 435, it is possible to form both the via trench 460 in the RRAM cell and the via trench 465 in the logic region using the same process steps. In certain embodiments, a duration of the first etching step is carefully controlled so that it is long enough to not overly etch the second stop layer portion 430, which could result in damage to the RRAM cell during the second etching step, but long enough to expose the thinned third stop layer 435 in the logic region.

At the process 550, a second metal pattern is formed in the second dielectric region 620. Portions of the second dielectric region 620 are typically removed using a photolithography process using a mask to form the second metal pattern. According to some embodiments, the second dielectric region may be etched using a dry etching process, however any suitable etching process may be used.

Figure 6E:
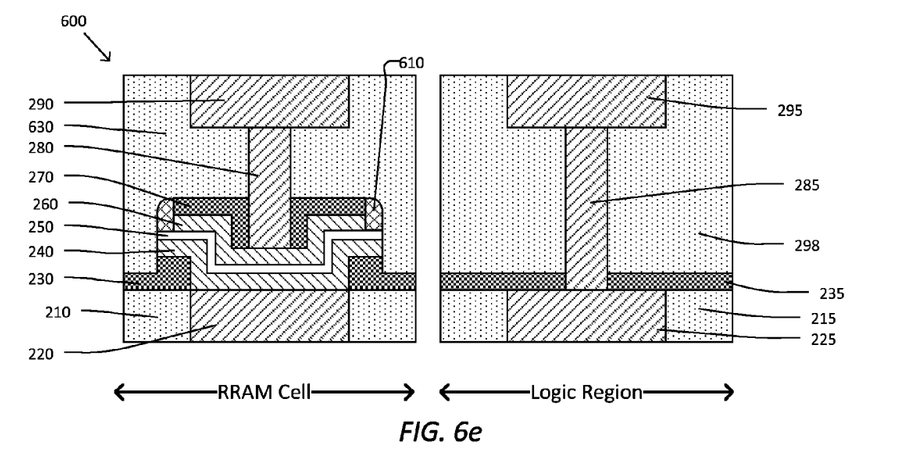

FIG. 6e shows a simplified diagram of a cross-sectional representation of a RRAM cell 600 according to certain embodiments of the present invention. At the process 560, vias 280 and 285, second metal layer 290, and fourth metal layer 295 are formed in the second dielectric region 620 to form the RRAM cell 600 as shown in FIG. 6e. The vias 280 and 285, second metal layer 290, and fourth metal layer 295 are typically formed using CVD, PVD, or ALD. However, any suitable deposition process may be used in process 560 to form the vias 280 and 285, second metal layer 290, and fourth metal layer 295.

As shown in FIG. 6e, the RRAM cell 600 may be formed on a substrate including the first dielectric region 210 with the embedded first metal layer 220. The first metal layer 220 may be used as a first contact and is used to couple the RRAM cell 600 to other circuitry in the semiconductor device. The first metal layer 220 may be in any metallization layer of a semiconductor device including any one of the first, second, third, fourth, or fifth metallization layers.

The first stop layer 230 is formed over the first dielectric region 210 and the first metal layer 220. A portion of the first stop layer 230 is removed to create an opening that may expose at least a portion of the first metal layer 220 to the RRAM cell 600. In some embodiments, the first stop layer 230 typically has a thickness between 10 nm and 50 nm. According to some embodiments, the first stop layer 230 includes one or more dielectrics. For example, each of the one or more dielectrics is selected from a group consisting of SiC, SiON, $Si_3N_4$, and the like.

The first electrode 240 is conformally formed over the first stop layer 230 and the exposed first metal layer 220. The first electrode 240 extends over the exposed first metal layer 220 and forms part of the second lip region that extends over a portion of the first stop layer 230. In some embodiments, the second lip region may extend beyond the opening in the first stop layer 230 a distance that varies between 20 nm and 60 nm. In some embodiments, the first electrode 240 may vary in thickness between 3 nm and 50 nm. In some embodiments, the first electrode 240 includes one or more metals. For example, each of the one or more metals is selected from a group consisting of Pt, AlCu, TiN, Au, Ti, Ta, TaN, W, WN, Cu, and the like.

The resistive layer 250 is conformally formed over the first electrode 240. The resistive layer 250 extends over the first electrode 240 and forms part of the second lip region that extends to substantially the same width as the first electrode 240. In some embodiments, the resistive layer 250 may vary in thickness between 1 nm and 30 nm. In some embodiments, the resistive layer 250 includes one or more metal oxides. For example, the one or more metal oxides are each selected from a group consisting of NiO, TiO, HfO, ZrO, ZnO, WO$_3$, Al$_2$O$_3$, TaO, MoO, CuO, and the like. In some embodiments, the resistive layer may include HfO with a resistivity on the order of $10^{14}$ Ω·cm. According to some embodiments, the resistive layer 250 has a high resistance state that varies between 100 kΩ and 10 MΩ and a low resistance state that varies between 1 kΩ and 100 kΩ.

The second electrode 260 is conformally formed on the resistive layer 250. The second electrode 260 extends over the resistive layer 250 and forms part of the first lip region that extends over a portion of the resistive layer 250. In some embodiments, the first lip region may extend over the resistive layer 250 to within 10 nm to 30 nm of the end of the corresponding second lip region on the resistive layer 250. In some embodiments, the second electrode 260 may vary in thickness between 3 nm and 50 nm. In some embodiments, the second electrode 260 includes one or more metals. For example, each of the one or more metals is selected from a group consisting of Pt, AlCu, TiN, Au, Ti, Ta, TaN, W, WN, Cu, and the like.

The second stop layer 270 is conformally formed on the second electrode 260. The second stop layer 270 extends over the second electrode 260 and forms part of the first lip region that extends to substantially the same width as the second electrode 260. A portion of the second stop layer 270 is removed from a central region of the second stop layer 270 to expose a portion of the second electrode 260 so that an electrical connection can be made. In some embodiments, the second stop layer 270 may vary in thickness between 10 nm and 50 nm. According to some embodiments, the second stop layer 270 includes one or more dielectrics. For example, each of the one or more dielectrics is selected from a group consisting of SiC, SiON, Si$_3$N$_4$, and the like.

The spacing layer 610 is conformally formed on the resistive layer 250 beyond the first lip region. In some embodiments, the spacing layer 610 extends beyond the first lip region to substantially the same width as the second lip region. In some embodiments, the spacing layer 610 may have a thickness between 40 nm and 100 nm. In some embodiments, the spacing layer 610 may have a thickness substantially the same as the combined thickness of the second electrode 260 and the second stop layer 270. In some embodiments, the spacing layer 610 includes one or more oxides and/or one or more nitrides.

The RRAM cell 600 is coupled to the second metal layer 290 through the via 280 formed between the second metal layer 290 and the second electrode 260. The upper portion of the RRAM cell 600 is embedded in a second dielectric region 630. The second metal layer 290 may be in any metallization layer of the semiconductor device including any one of the second, third, fourth, fifth, or sixth metallization layers.

FIG. 6e also depicts one possible structure in a corresponding logic region of the same semiconductor device. For example, an interconnection via 285 is shown coupling a third metal layer 225 embedded in a third dielectric region 215. The interconnection via 285 couples a third metal layer 225 and a fourth metal layer 295 through a third stop layer 235. The interconnection via 285 can be substantially embedded in a fourth dielectric region 298. As further depicted in FIG. 6e, the RRAM cell 600 and the corresponding logic region are depicted side-by-side to show the relationships between the various layers in the various regions of the semiconductor device. For example, the first dielectric region 210 and the third dielectric region 215 may be the same, the first metal layer 220 and the third metal layer 225 may both be in the same metallization layer of the semiconductor device, the first stop layer 230 and the third stop layer 235 may be the same, the second dielectric region 630 and the fourth dielectric region 298 may be the same, and the second metal layer 290 and the fourth metal layer 295 may both be in the same metallization layer of the semiconductor device.

Figure 7:
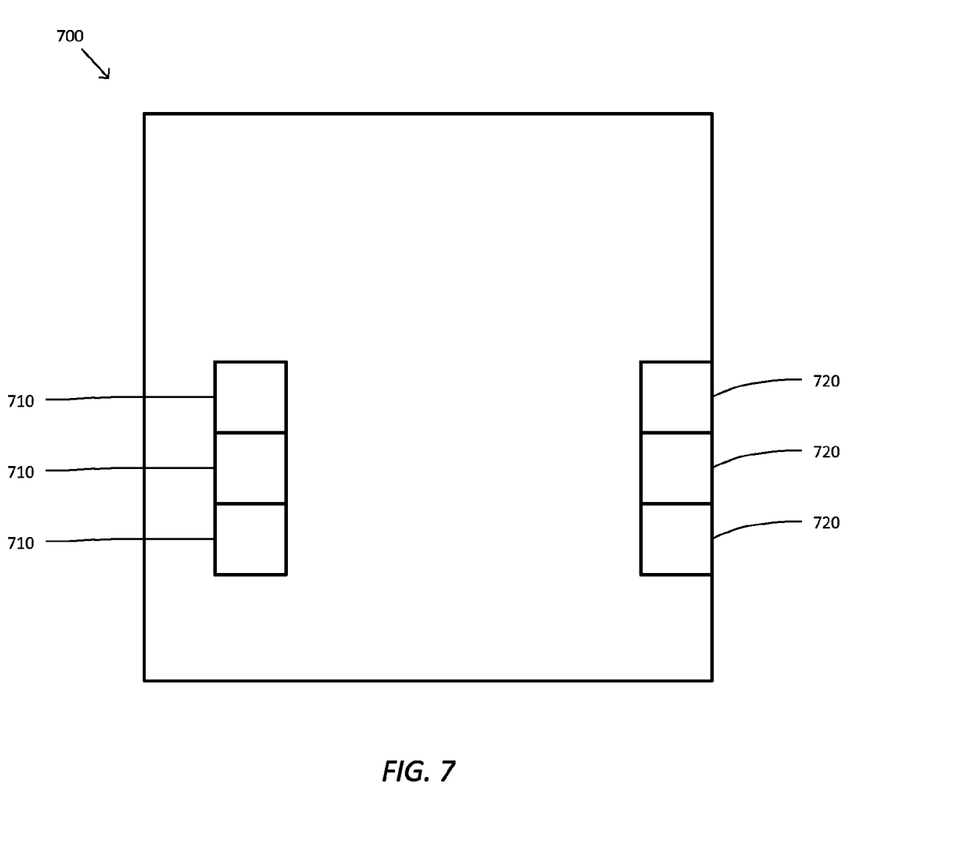
FIG. 7 is a simplified diagram of a device that includes one or more RRAM cells and I/O circuitry according to certain embodiments of the present invention.

FIG. 7 is a simplified diagram of a device 700 that includes one or more RRAM cells 710 and I/O circuitry 720 according to certain embodiments of the present invention. Examples of the device 700 include processors, controllers, logic devices, etc., where the RRAM cells 710 provide, at least in part, an embedded memory. In the alternative, the device 700 may be a stand-alone memory device, where a significant portion of the device 700 includes RRAM cells 710. According to certain embodiments, the RRAM cells 710 may be the RRAM cells 200 and/or the RRAM cells 600.

According to certain embodiments, a memory cell formed in a semiconductor device includes a first electrode conformally formed through a first opening in a first dielectric layer, the first dielectric layer being formed on a substrate including a first metal layer, the first opening being configured to allow physical contact between the first electrode and the first metal layer. The memory cell further includes a resistive layer conformally formed on the first electrode, a spacing layer conformally formed on the resistive layer, a second electrode conformally formed on the resistive layer, and a second dielectric layer conformally formed on the second electrode, the second dielectric layer including a second opening. The first electrode and the resistive layer collectively include a first lip region that extends a first distance beyond a region defined by the first opening. The second electrode and the second dielectric layer collectively include a second lip region that extends a second distance beyond the region defined by the first opening. The spacing layer extends over the resistive layer from the second distance to the first distance. The second electrode is coupled to a second metal layer using a via that extends through the second opening.

In some embodiments, the first lip region is at a first height different from a second height of the corresponding first electrode and the resistive layer located in the region defined by the first opening. In some embodiments, the second lip region is at a third height different from the first height, the second height, and a fourth height of the corresponding second electrode and the second dielectric layer located in the region defined by the first opening. In some embodiments, the first electrode includes at least one material selected from a group consisting of Pt, AlCu, TiN, Au, Ti, Ta, TaN, W, WN, and Cu. In some embodiments, the second electrode includes at least one material selected from a group consisting of Pt, AlCu, TiN, Au, Ti, Ta, TaN, W, WN, and Cu. In some embodiments, the resistive layer includes at least one material selected from a group consisting of NiO, TiO, HfO, ZrO, ZnO, WO$_3$, Al$_2$O$_3$, TaO, MoO, and CuO. In some embodiments, the first dielectric layer includes at least one material selected from a group consisting of SiC, SiON, and Si$_3$N$_4$. In some embodiments, the second dielectric layer includes at least one material selected from a group consisting of SiC, SiON, and Si$_3$N$_4$.

In some embodiments, the first dielectric layer and the second dielectric layer are stop layers. In some embodiments, the first electrode varies in thickness between 3 nm and 50 nm. In some embodiments, the second electrode varies in thickness between 3 nm and 50 nm. In some embodiments, the resistive layer varies in thickness between 1 nm and 30 nm. In some embodiments, the first dielectric layer varies in thickness between 10 nm and 50 nm. In some embodiments, the second dielectric layer varies in thickness between 10 nm and 50 nm. In some embodiments, the second distance varies between 10 nm and 30 nm and the first distance is between 10 nm and 30 nm longer than the second distance. In some embodiments, the spacing layer includes at least one selected from a group consisting of an oxide and a nitride. In some embodiments, the first distance and the second distance are between 10 nm and 60 nm. In some embodiments, the first electrode, resistive layer, and second electrode are formed in between a top of a third metallization layer and a top of a fourth metallization layer, the third metallization layer being the first metal layer and the fourth metallization layer being the second metal layer. In some embodiments, the first electrode, resistive layer, and second electrode are formed in between a top of a fourth metallization layer and a top of a fifth metallization layer, the fourth metallization layer being the first metal layer and the fifth metallization layer being the second metal layer. In some embodiments, the resistive layer includes a high resistance state that varies between 100 kΩ and 10 MΩ and the resistive layer includes a low resistance state that varies between 1 kΩ and 100 kΩ.

According to certain embodiments, a method for forming a memory cell includes forming a substrate including a first metal layer, forming a first dielectric layer on the substrate, forming a conformal first electrode through a first opening in a first dielectric layer, forming a conformal resistive layer on the first electrode, forming a conformal spacing layer on the resistive layer, forming a conformal second electrode on the resistive layer, forming a conformal second dielectric layer on the second electrode, the second dielectric layer including a second opening, and coupling the second electrode to a second metal layer using a via that extends through the second opening. The first opening is configured to allow physical contact between the first electrode and the first metal layer. The processes for forming the conformal first electrode and the conformal resistive layer include forming a first lip region that extends a first distance beyond a region defined by the first opening. The processes for forming the conformal second electrode and the conformal second dielectric layer include forming a second lip region that extends a second distance beyond the region defined by the first opening. The process for forming the spacing layer includes forming the spacing layer on the resistive layer over the second lip region between the second distance and the first distance.

In some embodiments, the first lip region is at a first height different from a second height of the corresponding first electrode and the resistive layer located in the region defined by the first opening. In some embodiments, the second lip region is at a third height different from the first height, the second height, and a fourth height of the corresponding second electrode and the second dielectric layer located in the region defined by the first opening. In some embodiments, the second distance is shorter than the first distance. In some embodiments, the processes for forming the conformal first electrode and the conformal second electrode do not include a chemical-mechanical polishing (CMP) process.

According to certain embodiments, a semiconductor device includes one or more memory cells. Each of the one or more memory cells includes a first electrode conformally formed through a first opening in a first dielectric layer, the first dielectric layer being formed on a substrate including a first metal layer, the first opening being configured to allow physical contact between the first electrode and the first metal layer. Each of the one or more memory cells further includes a resistive layer conformally formed on the first electrode, a spacing layer conformally formed on the resistive layer, a second electrode conformally formed on the resistive layer, and a second dielectric layer conformally formed on the second electrode, the second dielectric layer including a second opening. The first electrode and the resistive layer collectively include a first lip region that extends a first distance beyond a region defined by the first opening. The second electrode and the second dielectric layer collectively include a second lip region that extends a second distance beyond the region defined by the first opening. The spacing layer extends over the resistive layer from the second distance to the first distance. The second electrode is coupled to a second metal layer using a via that extends through the second opening. The first lip region is at a first height different from a second height of the corresponding first electrode and the resistive layer located in the region defined by the first opening. The second lip region is at a third height different from the first height, the second height, and a fourth height of the corresponding second electrode and the second dielectric layer located in the region defined by the first opening.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer having an opening over a first metal layer;
    forming a first electrode layer over the first dielectric layer and the first metal layer;
    forming a resistive layer over the first electrode layer;
    forming a second electrode layer over the resistive layer;
    forming a third dielectric layer over the second electrode layer;
    patterning the second electrode layer to form a first lip portion that extends laterally over the resistive layer by a first distance beyond a region defined by the opening, wherein patterning the second electrode layer to form the first lip portion further includes patterning the third dielectric layer to form the first lip portion;
    patterning the resistive layer and the first electrode layer to form a second lip portion that extends laterally over the first dielectric layer by a second distance beyond the region defined by the opening, the second distance being different than the first distance;
    forming a second dielectric layer over the patterned second electrode layer;
    forming a trench extending through the second dielectric layer to the patterned second electrode layer; and
    forming a conductive material within the trench.

2. The method of claim 1, wherein the first lip portion is at a first height different from a second height of the second lip portion.

3. The method of claim 1, forming a spacer layer directly on the patterned second electrode layer and the resistive layer.

4. The method of claim 1, further comprising forming a third dielectric layer over the second electrode layer, and
wherein patterning the second electrode layer to form the first lip portion further includes patterning the third dielectric layer to form the first lip portion.

5. The method of claim 4, wherein forming the trench extending through the second dielectric to the patterned second electrode layer includes forming the trench through the third dielectric layer.

6. The method of claim 1, further comprising forming a second metal layer over the conductive material.

7. The method of claim 1, wherein forming the second dielectric layer over the patterned second electrode layer includes forming the second dielectric layer directly on the first dielectric layer such that the second dielectric layer physically contacts the first dielectric layer.

8. A method comprising:
forming a first dielectric layer over a substrate having a first metal layer, the first dielectric layer defining an opening that exposes the first metal layer;
forming a first electrode layer within the opening and over the first dielectric layer and the first metal layer;
forming a second electrode layer over the first electrode layer;
patterning the second electrode layer to form a first lip portion that extends laterally over the substrate by a first distance beyond a region defined by the opening;
forming a spacer layer on the patterned second electrode layer;
patterning the first electrode layer to form a second lip portion that extends laterally over the substrate by a second distance beyond the region defined by the opening, the second distance being different than the first distance, wherein patterning the first electrode layer to form the second lip portion includes removing a portion of the first dielectric layer;
forming a second dielectric layer over the patterned second electrode layer;
forming a trench extending through the second dielectric layer to the patterned second electrode layer; and
forming a conductive material within the trench.

9. The method of claim 8, wherein the second distance is greater than the first distance.

10. The method of claim 8, further comprising forming a resistive layer over the first electrode layer, and
wherein forming the spacer layer on the patterned second electrode includes forming the spacer layer directly on the resistive layer such that the spacer layer physically contacts the resistive layer.

11. The method of claim 10, wherein patterning the first electrode layer to form the second lip portion includes patterning the resistive layer to form the second lip portion.

12. The method of claim 11, wherein patterning the resistive layer to form the second lip portion occurs after forming the spacer layer on the patterned second electrode.

13. The method of claim 8, wherein the first lip portion is at a first height different from a second height of the second lip portion.

14. The method of claim 8, wherein forming the second dielectric layer over the patterned second electrode layer includes forming the second dielectric layer over the patterned first electrode layer such that the second dielectric layer physically contacts the patterned second electrode layer and the patterned first electrode layer.

15. The method of claim 8, further comprising forming a third dielectric layer over the second electrode layer, and
wherein patterning the second electrode layer to form the first lip portion includes patterning the third dielectric layer to form the first lip portion.

16. A method for forming a memory cell, the method comprising:
forming a substrate including a first metal layer;
forming a first dielectric layer on the substrate;
forming a conformal first electrode through a first opening in a first dielectric layer, the first opening being configured to allow physical contact between the first electrode and the first metal layer;
forming a conformal resistive layer on the first electrode;
forming a conformal spacing layer on the resistive layer;
forming a conformal second electrode on the resistive layer;
forming a conformal second dielectric layer on the second electrode, the second dielectric layer including a second opening; and
coupling the second electrode to a second metal layer using a via that extends through the second opening;
wherein:
the processes for forming the conformal first electrode and the conformal resistive layer include forming a first lip region that extends a first distance beyond a region defined by the first opening;
the processes for forming the conformal second electrode and the conformal second dielectric layer include forming a second lip region that extends a second distance beyond the region defined by the first opening;
the process for forming the spacing layer includes forming the spacing layer on the resistive layer over the second lip region between the second distance and the first distance; and
the first lip region is at a first height different from a second height of the corresponding first electrode and the resistive layer located in the region defined by the first opening.

17. The method of claim 16, wherein the second lip region is at a third height different from the first height, the second height, and a fourth height of the corresponding second electrode and the second dielectric layer located in the region defined by the first opening.

18. The method of claim 16, wherein the second distance is shorter than the first distance.

19. The method of claim 16, wherein the processes for forming the conformal first electrode and the conformal second electrode do not include a chemical-mechanical polishing (CMP) process.

20. The method of claim 16, wherein the spacing layer physically contacts the conformal resistive layer and the conformal second electrode.

* * * * *